(12) United States Patent
Chua et al.

(10) Patent No.: US 7,994,624 B2
(45) Date of Patent: Aug. 9, 2011

(54) INTEGRATED CIRCUIT PACKAGE SYSTEM WITH ADHESIVE SEGMENT SPACER

(75) Inventors: Linda Pei Ee Chua, Singapore (SG); Byung Tai Do, Singapore (SG); Reza Argenty Pagaila, Singapore (SG)

(73) Assignee: Stats Chippac Ltd., Singapore (SG)

( * ) Notice: Subject to any disclaimer, the term of this patent is extended or adjusted under 35 U.S.C. 154(b) by 19 days.

(21) Appl. No.: 12/237,344

(22) Filed: Sep. 24, 2008

(65) Prior Publication Data

US 2010/0072630 A1    Mar. 25, 2010

(51) Int. Cl.
*H01L 23/02* (2006.01)
(52) U.S. Cl. ........ 257/686; 257/723; 257/787; 257/685; 257/E21.164; 257/E25.013
(58) Field of Classification Search .......... 257/723, 257/787, 685, 724, 784, E21.164, E25.013, 257/686
See application file for complete search history.

(56) References Cited

U.S. PATENT DOCUMENTS

| 6,531,784 | B1 | 3/2003 | Shim et al. |
| 7,023,096 | B2 | 4/2006 | Lee et al. |
| 7,037,756 | B1 | 5/2006 | Jiang et al. |
| 7,276,790 | B2 | 10/2007 | Seng |
| 7,298,032 | B2 | 11/2007 | Kim et al. |
| 2007/0296086 | A1 | 12/2007 | Ju et al. |
| 2008/0042251 | A1* | 2/2008 | Weng et al. ............ 257/686 |
| 2009/0001612 | A1* | 1/2009 | Song et al. ............ 257/787 |

* cited by examiner

*Primary Examiner* — Jarrett J Stark
(74) *Attorney, Agent, or Firm* — Mikio Ishimaru

(57) ABSTRACT

An integrated circuit package system includes attaching an adhesive segment spacer to an interposer assembly; mounting an integrated circuit over a carrier; mounting the interposer assembly over the integrated circuit with the adhesive segment spacer exposing an inner region of the integrated circuit and covering a periphery of the integrated circuit; and forming an encapsulation over the integrated circuit, the interposer assembly, and the adhesive segment spacer with the interposer assembly exposed with a recess in the encapsulation.

20 Claims, 5 Drawing Sheets

INTEGRATED CIRCUIT PACKAGE SYSTEM WITH ADHESIVE SEGMENT SPACER

TECHNICAL FIELD

The present invention relates generally to an integrated circuit package system and more particularly to an integrated circuit package system with a spacer.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Many conventional semiconductor (or "chip") packages are of the type where a semiconductor die is molded into a package with a resin, such as an epoxy molding compound. Numerous package approaches stack multiple integrated circuit dice or package in package (PIP) or a combination. Other approaches include package level stacking or package on package (POP). POP designs face reliability challenges and higher cost.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system includes attaching an adhesive segment spacer to an interposer assembly; mounting an integrated circuit over a carrier; mounting the interposer assembly over the integrated circuit with the adhesive segment spacer exposing an inner region of the integrated circuit and covering a periphery of the integrated circuit; and forming an encapsulation over the integrated circuit, the interposer assembly, and the adhesive segment spacer with the interposer assembly exposed with a recess in the encapsulation.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
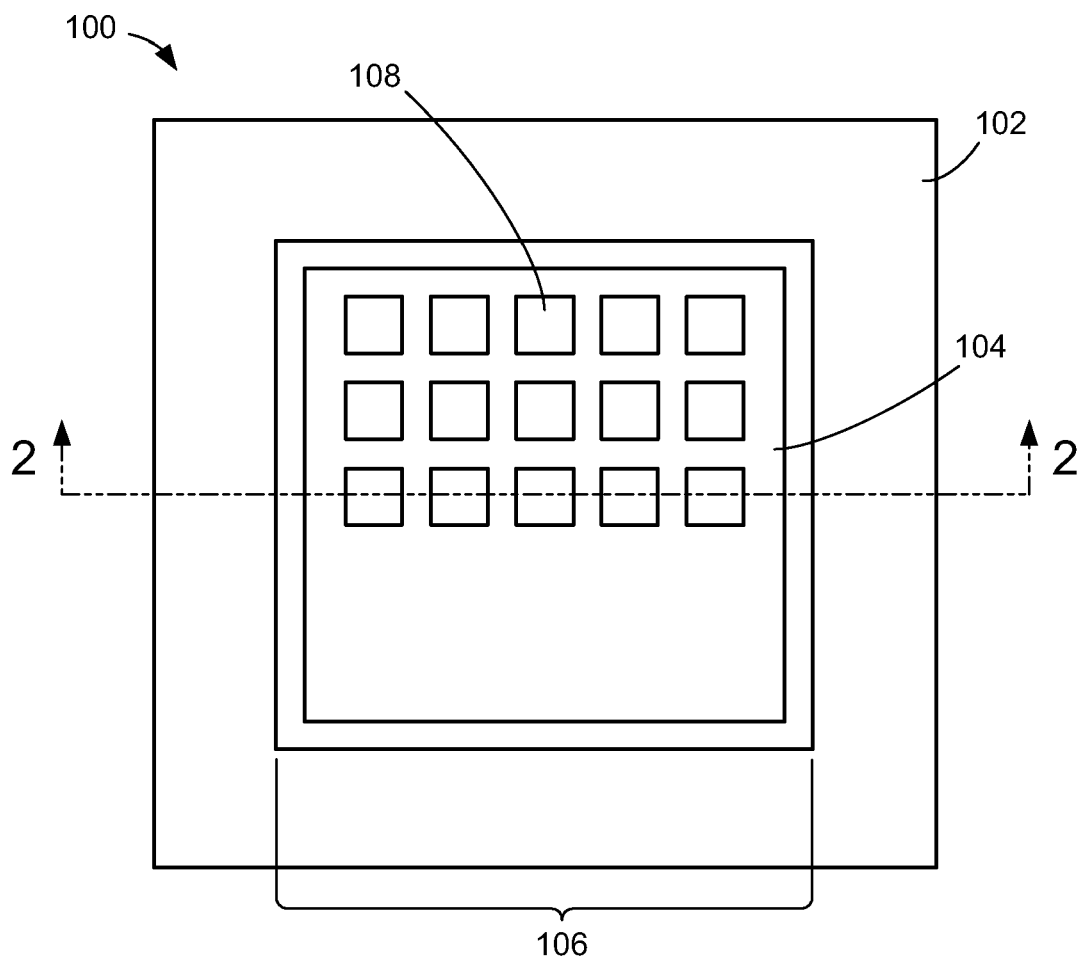
FIG. 1 is a top view of an integrated circuit package system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane.

The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used.

Referring now to FIG. 1, therein is shown a top view of an integrated circuit package system 100 in a first embodiment of the present invention. The top view depicts an encapsulation 102, such as a cover including an epoxy molding compound, with an interposer 104, such as a laminated substrate, exposed in a recess 106 of the encapsulation 102. The interposer 104 can have terminal pads 108 exposed by the recess 106. For clarity, not all the terminal pads 108 are shown in FIG. 1.

For illustrative purposes, the recess 106 exposing the interposer 104 is shown as having a square geometric configuration, although it is understood that the recess 106 can have a different geometric configuration. For example, the recess 106 can have a rectangular configuration.

Figure 2:
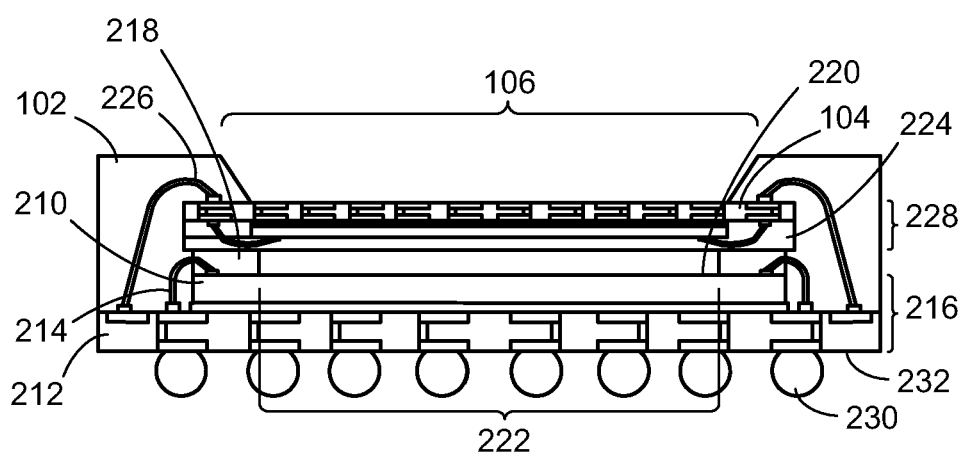
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. An integrated circuit 210, such as an integrated circuit die or flip chip, can be over a carrier 212, such as a laminated substrate. A first internal interconnect 214, such as a bond wire, can connect the carrier 212 to the integrated circuit 210. A carrier assembly 216 can include the integrated circuit 210, the carrier 212, and the first internal interconnect 214.

An interposer assembly 228 can include a device 224, such as an encapsulated integrated circuit die, and the interposer 104. The interposer 104 can be over the device 224. A second internal interconnect 226, such as a bond wire, can connect the interposer 104 with the carrier 212.

An adhesive segment spacer 218, such as a wire in film adhesive having B-stage characteristics, can be attached to the device 224 of the interposer assembly 228. A material having B-stage characteristics is a material characterized by softening of the material when heated and when in the B-stage the material is uncured. The adhesive segment spacer 218 can be attached to a periphery of an integrated circuit top side 220 of the integrated circuit 210, exposing an inner region 222 of the integrated circuit 210. The adhesive segment spacer 218 may be applied to the integrated circuit 210 without extending below the integrated circuit top side 220. A portion of the first internal interconnect 214 over the connection with the integrated circuit 210 can be embedded in the adhesive segment spacer 218 while the portion below the integrated circuit top side 220 remains exposed.

The encapsulation 102, can be over the carrier 212 covering the integrated circuit 210, the adhesive segment spacer 218, the device 224, the first internal interconnect 214, the second internal interconnect 226, and the interposer 104. The interposer 104 can be exposed through the recess 106. The encapsulation 102 can fill a space between the inner region 222 of the integrated circuit 210 and the interposer assembly 228. External interconnects 230 can be attached to a carrier bottom side 232 of the carrier 212.

Figure 3:
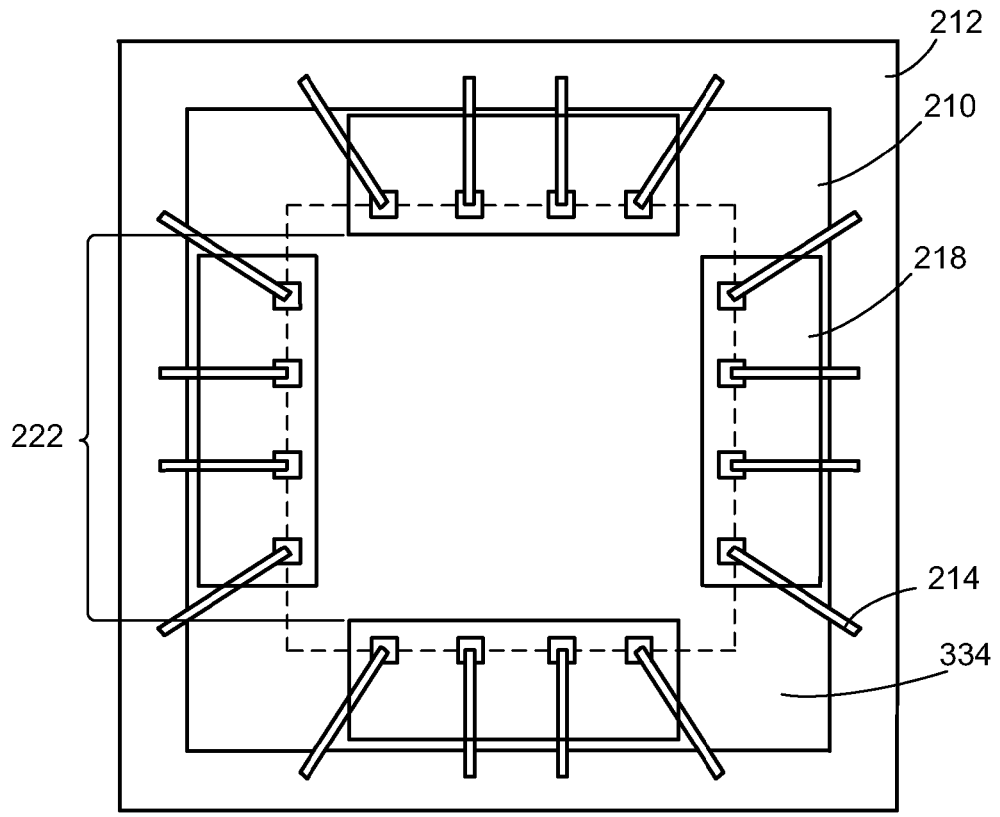
FIG. 3 is a top plan view of the integrated circuit package system of FIG. 1 without the interposer assembly of FIG. 2, the encapsulation of FIG. 2, and the second internal interconnect of FIG. 2.

Referring now to FIG. 3, therein is shown a top plan view of the integrated circuit package system 100 of FIG. 1 without the interposer assembly 228 of FIG. 2, the encapsulation 102 of FIG. 2, and the second internal interconnect 226 of FIG. 2. The top plan view depicts the integrated circuit 210 over the carrier 212. The first internal interconnect 214 can connect the integrated circuit 210 and the carrier 212.

The adhesive segment spacer 218 can be mounted over the integrated circuit 210 exposing a portion of the peripheral region of the integrated circuit 210. The top plan view depicts the adhesive segment spacer 218 along each side of the integrated circuit 210. The adhesive segment spacer 218 does not extend to corner regions 334 of the integrated circuit 210. The space between the adhesive segment spacer 218 at each side of the integrated circuit 210 and at the inner region 222 allows the encapsulation 102 to form mold locks with the interposer assembly 228 attached to the integrated circuit 210.

It has been discovered that the present invention provides an integrated circuit package system having improved reliability and lower cost by reducing or eliminating delamination by using adhesive segment spacers. The space between the adhesive segment spacers allows the encapsulation to form mold locks with the interposer assembly, the integrated circuit, and the adhesive segment spacers themselves. The encapsulation is also lower cost than the adhesive segment spacer.

Figure 4:
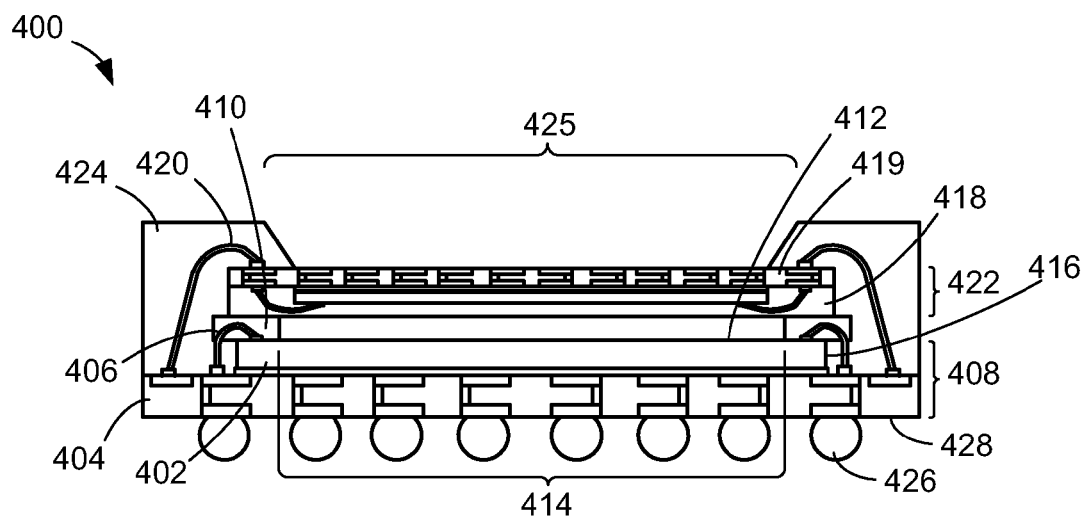
FIG. 4 is a cross-sectional view of an integrated circuit package system exemplified by the top view along line 2-2 of FIG. 1 in a second embodiment of the present invention.

Referring now to FIG. 4, therein is shown a cross-sectional view of an integrated circuit package system 400 exemplified by the top view along line 2-2 of FIG. 1 in a second embodiment of the present invention. An integrated circuit 402, such as an integrated circuit die, can be over a carrier 404, such as a laminated substrate. A first internal interconnect 406, such as a bond wire, can connect the carrier 404 to the integrated circuit 402. A carrier assembly 408 can include the integrated circuit 402, the carrier 404, and the first internal interconnect 406.

An adhesive segment spacer 410, such as a wire-in-film adhesive having a B-stage characteristic, can be attached to the periphery of an integrated circuit top side 412 of the integrated circuit 402, exposing an inner region 414 of the integrated circuit 402. The adhesive segment spacer 410 can overhang a vertical side 416 of the integrated circuit 402. A portion of the first internal interconnect 406 over and adjacent to the connection with the integrated circuit 402 can be embedded in the adhesive segment spacer 410.

A device 418, such as an encapsulated integrated circuit die, can be mounted over the adhesive segment spacer 410. An interposer 419 can be over the device 418. A second internal interconnect 420, such as a bond wire, can connect the interposer 419 with the carrier 404. An interposer assembly 422 can include the device 418 and the interposer 419.

An encapsulation 424 can be over the carrier 404 covering the integrated circuit 402, the adhesive segment spacer 410, the device 418, the first internal interconnect 406, the second internal interconnect 420, and the interposer 419. The interposer 419 can be exposed through a recess 425 of the encapsulation 424. The encapsulation 424 can fill the space between the inner region 414 of the integrated circuit 402 and the interposer assembly 422. External interconnects 426 can be attached to a carrier bottom side 428.

Figure 5:
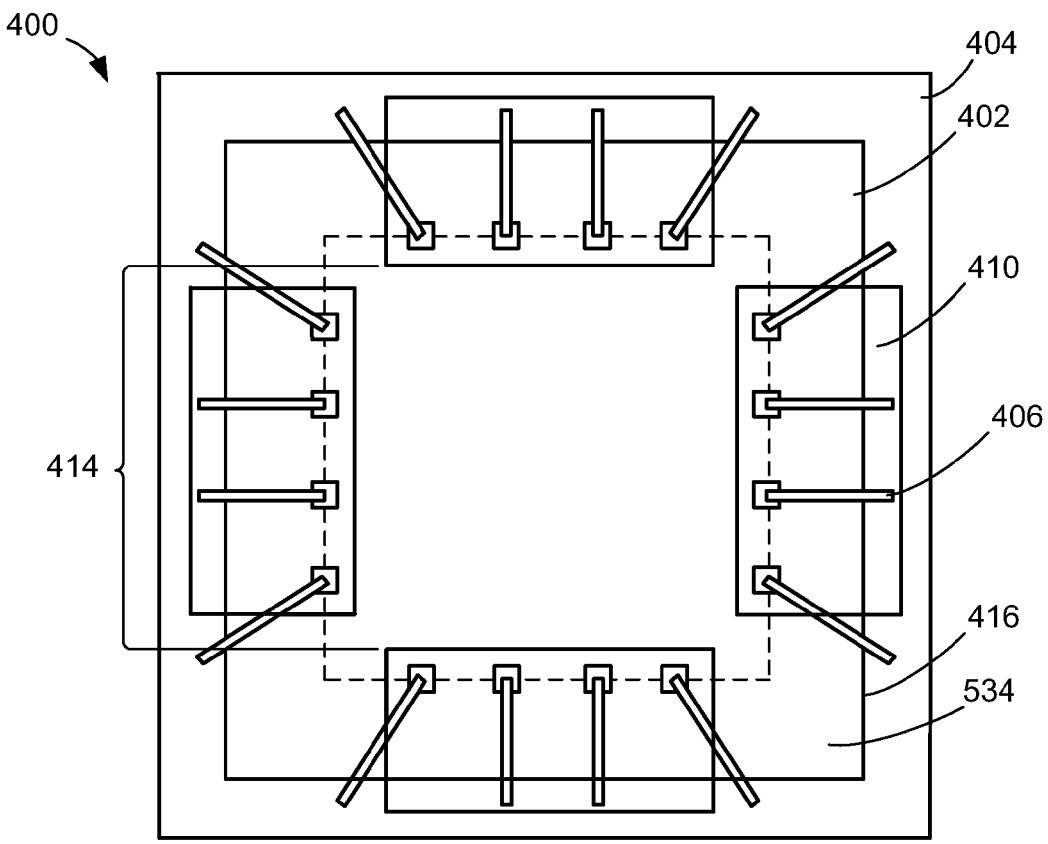
FIG. 5 is a top plan view of the integrated circuit package system of FIG. 4 without the interposer assembly of FIG. 4, the encapsulation of FIG. 4, and the second internal interconnect of FIG. 4.

Referring now to FIG. 5, therein is shown a top plan view of the integrated circuit package system 400 of FIG. 4 without the encapsulation 424 of FIG. 4, the interposer assembly 422 of FIG. 4, and the second internal interconnect 420 of FIG. 4. The top plan view depicts the integrated circuit 402 over the carrier 404. The first internal interconnect 406 can connect the integrated circuit 402 and the carrier 404.

The adhesive segment spacer 410 can be mounted over the integrated circuit 402 overhanging a portion of the vertical side 416 of the integrated circuit 402. The overhanging portion of the adhesive segment spacer 410 can embed a portion of the first internal interconnect 406 near the vertical side 416 providing additional support for the first internal interconnect 406. The additional support prevents or minimizes wire sweeps during the molding process to form the encapsulation 424. The reduction in the wire sweep eliminates or reduces inadvertent shorting between the wires and eliminates or reduces connection breaks of the first internal interconnect 406 with the integrated circuit 402 or the carrier 404.

It has also been discovered that the present invention provides an integrated circuit package system having an adhesive segment spacer with improved reliability by eliminating inadvertent wire shorting and connection breaks of the wires. The overhanging portion of the adhesive segment spacer embeds more of the first internal interconnect providing additional support to the first internal interconnect. The additional support eliminates or reduces the wire sweeps, inadvertent shorting of the wires, and connection breaks.

The adhesive segment spacer 410 does not extend to corner regions 534 of the integrated circuit 402. The space between the adhesive segment spacer 410 at each side of the integrated circuit 402 and at the inner region 414 allows the encapsulation 424 to form mold locks with the interposer assembly 422 attached to the integrated circuit 402.

Figure 6:
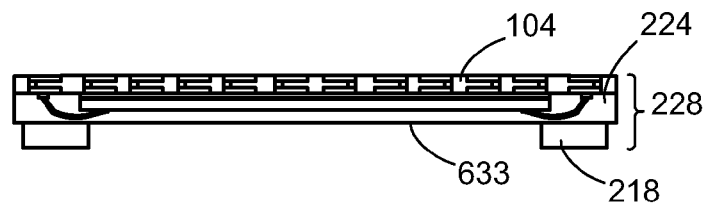
FIG. 6 is a cross-sectional view of the interposer assembly of the integrated circuit package system of FIG. 2 in attaching the adhesive segment spacer.

Referring now to FIG. 6, therein a cross-sectional view of the interposer assembly 228 of the integrated circuit package system 100 of FIG. 2. The cross-sectional view depicts an intermediate stage of assembly in an embodiment of the present invention. The cross-sectional view depicts the adhesive segment spacer 218 attached to the interposer assembly 228. The adhesive segment spacer 218 can be attached to a device bottom side 633 of the device 224 by a screen printing process or stencil printing process. The adhesive segment spacer 218 can be preformed before attached to the device 224. The adhesive segment spacer 218 can be mounted to align with the portion of the first internal interconnect 214 of FIG. 2 which is connected to the integrated circuit 210 of FIG. 2.

Figure 7:
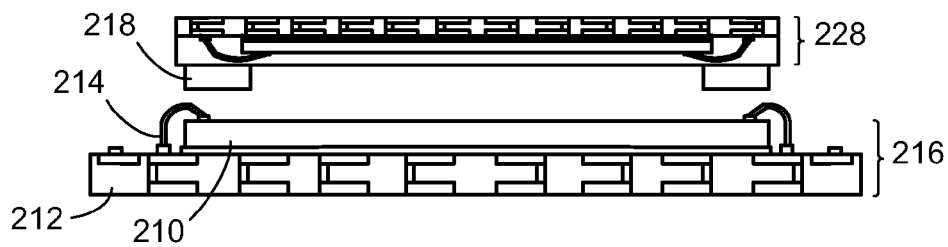
FIG. 7 is a cross-sectional view of the integrated circuit package system of FIG. 2 in mounting the interposer assembly.

Referring now to FIG. 7, therein is shown a cross-sectional view of the integrated circuit package system 100 of FIG. 2 in mounting the interposer assembly 228. The cross-sectional view depicts mounting the interposer assembly 228 over the carrier assembly 216. The interposer assembly 228 having the adhesive segment spacer 218 attached thereto can be heated to an elevated temperature sufficient to make the adhesive segment spacer 218 permeable.

The interposer assembly 228 can be aligned over the integrated circuit 210 with the adhesive segment spacer 218 aligned over the portion of the first internal interconnect 214 which is connected to the integrated circuit 210. The interposer assembly 228 mounts over the carrier assembly 216. The adhesive segment spacer 218, in permeable state, can be pressed over the first internal interconnect 214. The adhesive segment spacer 218 can embed a portion of the first internal interconnect 214 over the integrated circuit 210. The combined structure with the interposer assembly 228, the adhesive segment spacer 218, and the carrier assembly 216 can be heated to cure the adhesive segment spacer 218.

Figure 8:
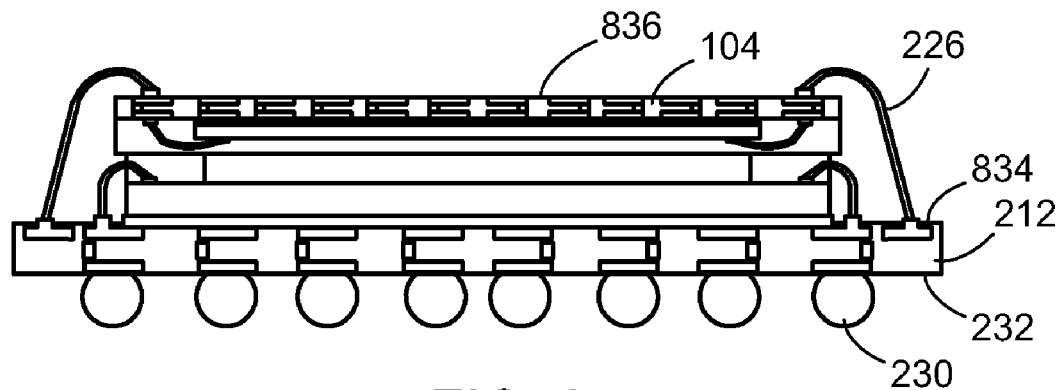
FIG. 8 is the structure of FIG. 7 connecting the carrier and the interposer.

Referring now to FIG. 8, therein is shown the structure of FIG. 7 in connecting the interposer 104 and the carrier 212. The second internal interconnect 226 can connect a carrier top side 834 to an interposer top side 836. The external interconnects 230 can be attached to the carrier bottom side 232.

Figure 9:
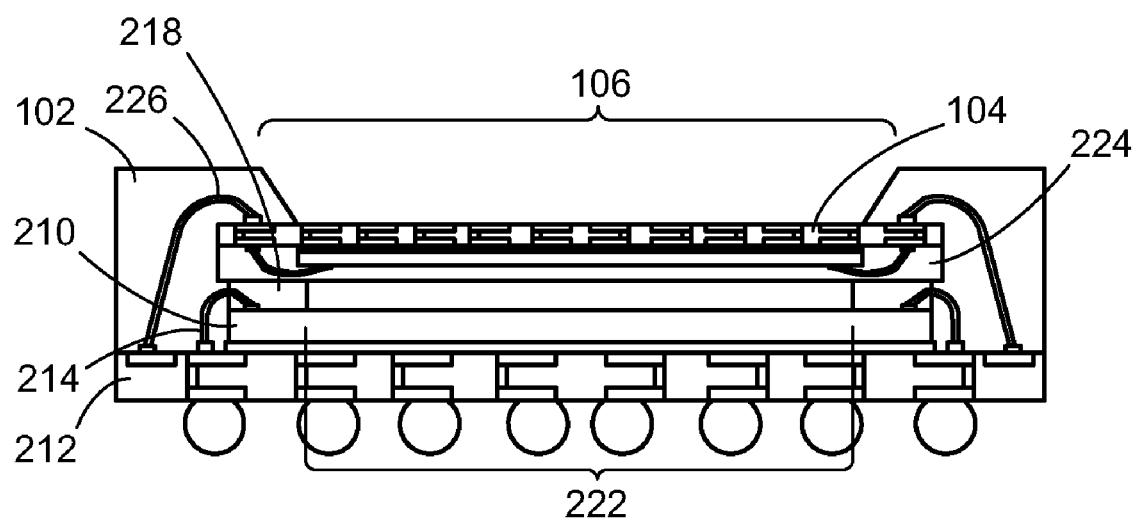
FIG. 9 is the structure of FIG. 8 in forming the encapsulation.

Referring now to FIG. 9, therein is shown the structure of FIG. 8 in forming the encapsulation 102. The encapsulation 102 can be over the carrier 212 covering the integrated circuit 210, the first internal interconnect 214, the second internal interconnect 226, the adhesive segment spacer 218, the device 224 and the interposer 104. The recess 106 can be formed in the encapsulation 102 to expose the interposer 104. The recess 106 can be formed in a number of ways. For example, a mold chase (not shown) having a contour to the recess 106 can be used form the encapsulation 102 having the recess 106.

Figure 10:
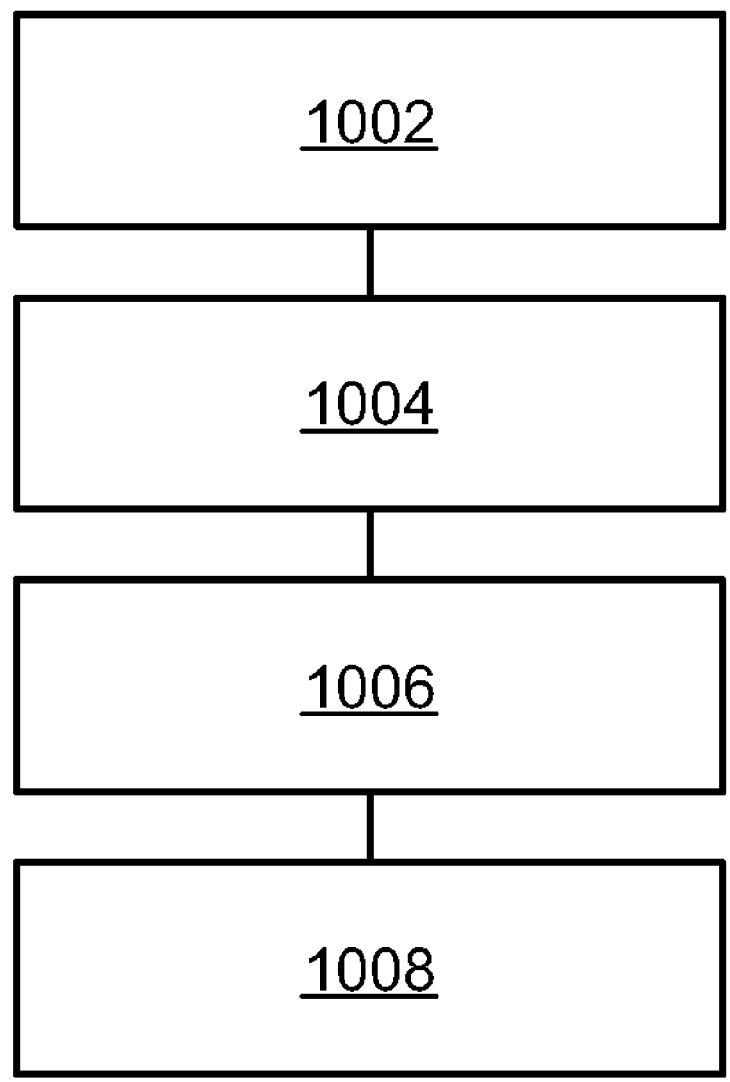
FIG. 10 is a flow chart of an integrated circuit package system for manufacture of the integrated circuit package system in an embodiment of the present invention.

Referring now to FIG. 10, therein is shown a flow chart of an integrated circuit package system 1000 for manufacture of the integrated circuit package system 100 in an embodiment of the present invention. The system 1000 includes attaching an adhesive segment spacer to an interposer assembly in a block 1002; mounting an integrated circuit over a carrier in a block 1004; mounting the interposer assembly over the integrated circuit with the adhesive segment spacer exposing an inner region of the integrated circuit and covering a periphery of the integrated circuit in a block 1006; and forming an encapsulation over the integrated circuit, the interposer assembly, and the adhesive segment spacer with the interposer assembly exposed with a recess in the encapsulation in a block 1008.

Yet other important aspects of the embodiments include that it valuably supports and services the historical trend of reducing costs, simplifying systems, and increasing performance.

These and other valuable aspects of the embodiments consequently further the state of the technology to at least the next level.

Thus, it has been discovered that the integrated circuit package system of the present invention furnishes important and heretofore unknown and unavailable solutions, capabilities, and functional aspects for improving reliability in systems. The resulting processes and configurations are straightforward, cost-effective, uncomplicated, highly versatile, and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
    attaching an adhesive segment spacer to an interposer assembly;
    mounting an integrated circuit over a carrier;
    mounting the interposer assembly over the integrated circuit with the adhesive segment spacer on the interposer assembly and only on a periphery of the integrated circuit, to not extend below an integrated circuit top side, including exposing an inner region of the integrated circuit top side; and
    forming an encapsulation over the integrated circuit, the interposer assembly, and the adhesive segment spacer with the interposer assembly having terminal pads exposed with a recess in the encapsulation.

2. The system as claimed in claim 1 wherein mounting the interposer assembly over the integrated circuit with the adhesive segment spacer over the periphery of the integrated circuit includes exposing a corner region of the integrated circuit.

3. The system as claimed in claim 1 further comprising:
connecting a first internal interconnect between the integrated circuit and the carrier; and
wherein mounting the interposer assembly over the integrated circuit with the adhesive segment spacer covering the periphery of the integrated circuit includes:
embedding a portion of the first internal interconnect over the integrated circuit.

4. The system as claimed in claim 1 wherein mounting the interposer assembly over the integrated circuit with the adhesive segment spacer over the periphery of the integrated circuit includes overhanging the adhesive segment spacer over the integrated circuit.

5. The system as claimed in claim 1 wherein attaching the adhesive segment spacer to the interposer assembly includes attaching a device to the adhesive segment spacer.

6. An integrated circuit package system comprising:
providing an interposer assembly having a device attached to an interposer;
attaching an adhesive segment spacer to the device;
mounting an integrated circuit over a carrier;
mounting the interposer assembly over the integrated circuit with the adhesive segment spacer on the interposer assembly and only on a periphery of the integrated circuit, to not extend below an integrated circuit top side, including exposing an inner region of the integrated circuit top side; and
forming an encapsulation over the integrated circuit, the interposer assembly, and the adhesive segment spacer with the interposer having terminal pads exposed with a recess in the encapsulation.

7. The system claimed in claim 6 wherein forming the encapsulation includes covering the inner region of the integrated circuit.

8. The system as claimed in claim 6 wherein attaching the adhesive segment spacer includes attaching a penetrable film adhesive having a B-stage characteristic.

9. The system claimed in claim 6 further comprising connecting the interposer and the carrier with a second internal interconnect.

10. The system as claimed in claim 6 further comprising mounting an external interconnect to a carrier bottom side of the carrier.

11. An integrated circuit package system comprising:
a carrier;
an integrated circuit over the carrier;
an interposer assembly over the integrated circuit;
an adhesive segment spacer on the interposer assembly and only on a periphery of the integrated circuit, to not extend below an integrated circuit top side, with an inner region of the integrated circuit not in contact with the adhesive segment spacer; and
an encapsulation over the integrated circuit, the interposer assembly, and the adhesive segment spacer with the interposer assembly having terminal pads exposed with a recess in the encapsulation.

12. The system as claimed in claim 11 wherein the adhesive segment spacer exposes a portion of a corner region of the integrated circuit.

13. The system as claimed in claim 11 further comprising:
a first internal interconnect between the integrated circuit and the carrier; and
wherein:
the adhesive segment spacer embeds a portion of the first internal interconnect over the integrated circuit.

14. The system as claimed in claim 11 wherein the adhesive segment spacer overhangs the integrated circuit.

15. The system as claimed in claim 11 wherein the interposer assembly includes a device.

16. The system as claimed in claim 11 wherein:
the interposer assembly includes a device attached to an interposer; and
the adhesive segment spacer is attached to the device.

17. The system claimed in claim 16 wherein the encapsulation is over the inner region of the integrated circuit.

18. The system as claimed in claim 16 wherein the adhesive segment spacer includes a penetrable film adhesive having a B-stage characteristic.

19. The system claimed in claim 16 further comprising a second internal interconnect connected between the interposer and the carrier.

20. The system as claimed in claim 16 further comprising an external interconnect mounted to a carrier bottom side of the carrier.

* * * * *